United States Patent [19]
Michaelis

[11] 4,164,790
[45] Aug. 14, 1979

[54] MAGNETIC BUBBLE PACKAGING ARRANGEMENT

[75] Inventor: Paul C. Michaelis, Watchung, N.J.

[73] Assignee: Bell Telephone Laboratories, Incorporated, Murray Hill, N.J.

[21] Appl. No.: 864,311

[22] Filed: Dec. 27, 1977

[51] Int. Cl.² .............................................. G11C 19/08
[52] U.S. Cl. ....................................................... 365/2
[58] Field of Search .......................................... 365/2

[56] References Cited
U.S. PATENT DOCUMENTS 3,996,574  12/1976  Bobeck et al. .......................... 365/2

Primary Examiner—James W. Moffitt
Attorney, Agent, or Firm—Herbert M. Shapiro

[57] ABSTRACT

A magnetic bubble memory of the field-access type employs a novel package arrangement for containing the field coils within desired limits during fabrication of the package.

10 Claims, 4 Drawing Figures

MAGNETIC BUBBLE PACKAGING ARRANGEMENT

FIELD OF THE INVENTION

This invention relates to magnetic bubble memories.

BACKGROUND OF THE INVENTION

Magnetic bubble memories are well known in the art. One mode of operating such memories is called the "conductor-access" mode. Such a mode employs electrical conductor patterns overlying the layer in which bubbles move. Currents impressed in the conductors generate localized field gradients which move the bubbles.

An alternative mode of operating a bubble memory is called the "field-access" mode. The movement of bubbles in this mode is responsive to a magnetic field reorienting in the plane of bubble movement. Localized field gradients necessary for bubble movement are due to patterns of magnetically soft material in a layer coupled to the bubble layer. The in-plane field generates changing pole patterns in the magnetically soft material and the pole patterns cause bubble movement.

In both the conductor-access and the field-access arrangements, a magnetic bias field antiparallel to the magnetization of a bubble maintains the bubbles at some nominal operating diameter. Since bubble layers are characterized by a uniaxial anisotropy normal to the plane of bubble movement, the direction of the bias field is normal to that plane also.

In a field-access arrangement, in addition to the bias field magnet, coils are necessary to generate the inplane field as is well known. These coils have to be quite precise in order to generate a sufficiently uniform field over an entire bubble chip (or chips) encompassed within the confines of the coils. Because the in-plane field is generated, typically, by two coils driven in quadrature, one coil is placed within another leading to considerable constraints on coil design.

One problem in coil manufacture is that the strands of the outer coil for a field-access bubble memory migrate uncontrollably during the requisite molding operation which follows placement of the coils. Another problem is that multiple chip packaging requires close tolerances in coil winding which are expensive to achieve. Thus, the coils are expensive and packaging causes unwanted variations in the coils.

BRIEF DESCRIPTION OF THE INVENTION

A solution to the problem is to wind the outer coil for a bubble field-access memory on a bobbin and to design the packaging for the memory to constrain the outer coil during potting. In this case, the migration of the outer coil is turned to account by directing that migration so that the outer coils have like characteristics. The use of a bobbin for bearing the outer coil and a mold into which the outer coil migrates to a predetermined shape allows relaxation of the tolerances in coil winding yet achieves a high degree of uniformity of in-plane field characteristics.

DETAILED DESCRIPTION

Figure 1:
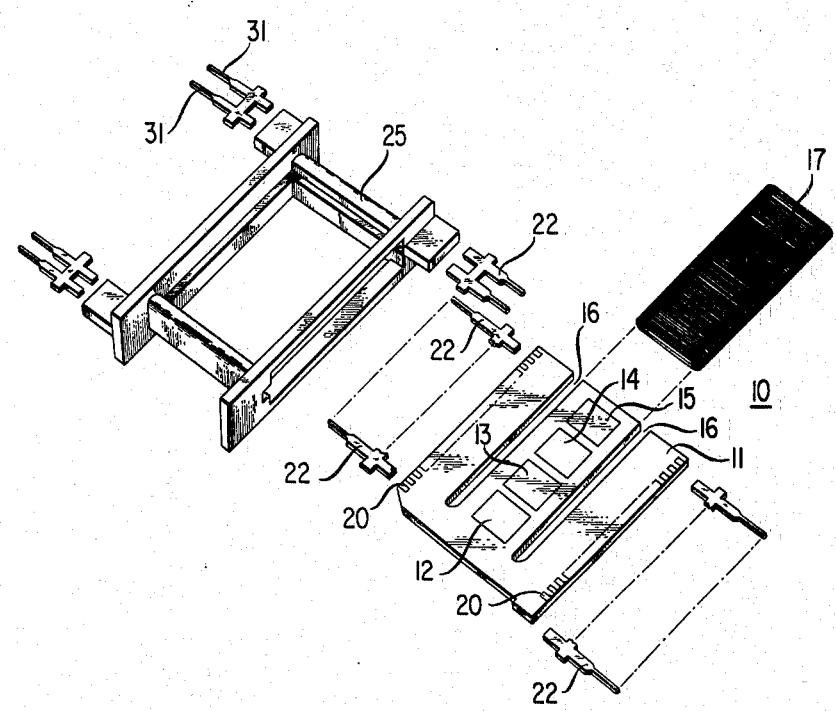
FIGS. 1, 2 and 3 are exploded views of portions of a magnetic bubble memory package in accordance with this invention.

FIG. 1 shows a magnetic bubble chip assembly 10. The assembly includes a circuit board or support 11 and, illustratively, four memory chips 12, 13, 14, and 15. The support includes two parallel slots 16 for accepting a coil 17. Conducting paths (not shown) are formed on the surfaces of support 11 for interconnection of the chips to lands 20. The assembly is of a form shown in A. H. Bobeck, B. H. McGahey, W. M. Melbert, Jr., T. B. Prince, and M. J. Stevenson, U.S. Pat. No. 3,996,574, issued Dec. 7, 1976. Pins 22 are attached to lands 20 for external connection.

Figure 2:
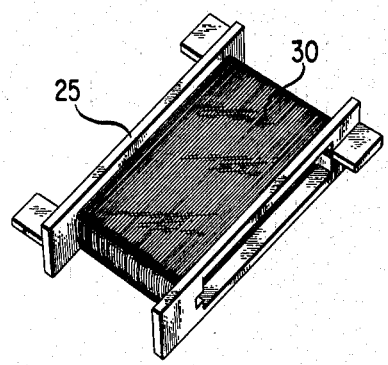

A bobbin 25 is adapted to mate with assembly 10 with (inner) coil 17 in place in slots 16. Bobbin 25 is used as a mandrel on which "outer" coil 30 of FIG. 2 is wound prior to placement on assembly 10. The outer and inner coils are connected to leads 31 and 32 of FIG. 1, respectively. The bobbin constrains coil 30 and, in addition, provides a fixture for maintaining the chip assembly (11) in a plane with respect to the outer coil. The bobbin is constructed of nonmagnetic material illustratively "RYTON-R4," a glass filled polyphenyl sulfide available from Phillips Petroleum Corporation.

Figure 3:
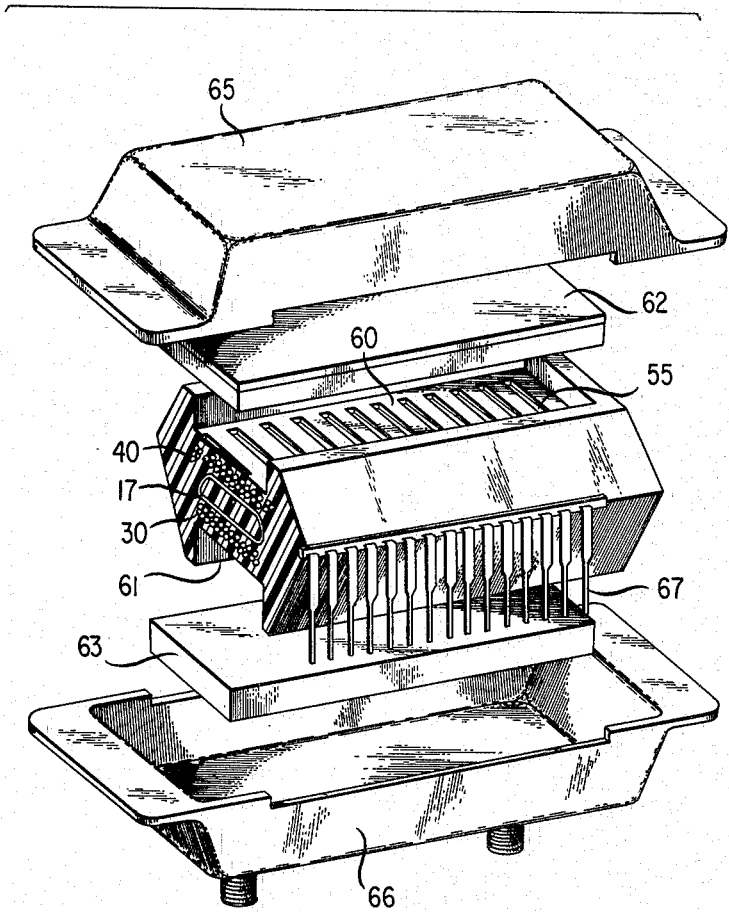
Figure 4:
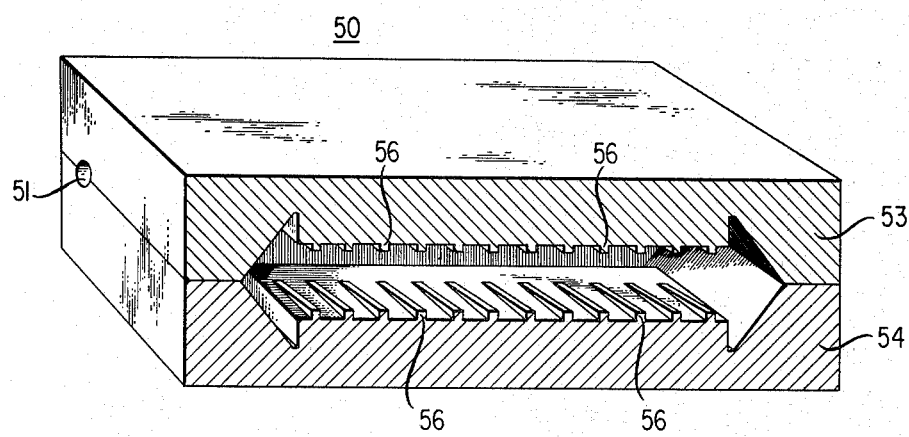
FIG. 4 is a plan view, partially in cross-section of a mold for forming the package of FIGS. 1-3.

The outer coil is further constrained by the inner coil and by an enclosure secured about it during a subsequent potting procedure. FIG. 3 shows an exploded view of a potted package subassembly including the chip assembly of FIG. 1 and the bobbin and coil of FIG. 2. The Figure also shows an initializing coil 40 serving to clear the bubble chips of bubbles prior to shipment of the packages. FIG. 4 shows, in cross-section, a mold 50 used during the potting of the subassembly. The chip assembly is placed within mold 50 and a potting compound is injected at 51. A second port (not seen) provides an egress for the excess potting compound.

The potting compound causes the wires or strands of coil 30 to adjust separations therebetween and to migrate both inwardly and outwardly to an extent allowed by the constraints. The use of the bobbin and the mold to confine this adjustment thus turns to account the previously deleterious affect of the introduction of the potting compound.

At the termination of the potting step, piece parts 52 and 53 of FIG. 4 are separated and the subassembly of FIG. 3 is removed. The top and bottom broad surfaces of the subassembly is shown grooved in FIG. 3 as represented by grooves 55. Grooves 55 are formed by ribs 56 in mold 50 of FIG. 4. The ribs are operative to confine the outward migration of coil 30 and to still allow sufficient coverage by potting compound therebetween to retain the final coil geometry when the potting step is complete. Wide differences in the numbers of and spacings between the ribs seem to have little affect on the benefits realized in the migration of the coil into constraints to achieve a superior package.

The subassembly includes recesses, top and bottom as viewed in FIG. 3, designated 60 and 61, respectively. Magnets 62 and 63 are placed into those recesses and are operative to provide a bias field characteristic of magnetic bubble memories. Magnetically soft lids 65 and 66 are placed over the subassembly leaving only pins 67 protruding.

The use of the bobbin alone results in significant package improvement. Firstly, it avoids misalignment of the outer coil, mislocation of the inner coil, and rotation of the chip plane. Secondly, the bobbin correctly locates a Z coil (initializing coil 40) in the chip plane and at a fixed distance from that plane and minimizes capacitive coupling variation from the inner and outer coils. Thirdly, the bobbin permits total encapsulation of the chips and inner coils. This was not achievable hitherto because of the requisite use of shims to align the coils properly. The bobbin also maintains the chip support on circuit board in a plane. Previously, the circuit board meandered out of plane during the potting step.

The advantages of the use of a bobbin in cooperation with a constraining mold to force the outer coil into a prescribed geometry which is fixed during the potting step are clear from a recitation of prior art requirements on coils as compared to coils wound on a bobbin. Firstly, an important feature of the mold is the ribbing as shown in FIG. 4. The ribs are of a geometry to confine the outer coil yet allow potting compound to flow between the ribs. For production packages, the ribs are tapered from 4 to 20 mils high by 20 mils by 0.45 inch wide on quarter inch spacings. The use of the bobbin and a constraining mold allow the outer coils to be wound by machine in 30 seconds. Previously, the coils had to be wound mostly by hand and required 45 minutes in order to achieve the necessary perfection. The bobbin cost is on the order of 10 cents. Typically, the outer coil has inside and outside dimensions of 140 mils and 242 mils respectively. These dimensions are held to within ±2 mils by the constraints herein. Previously, essentially only hand wound and adjusted coils could be kept to these tolerances. Outer coils typically have an inductance of 15 microhenries ±3%. The best achievable in any quantity previously is typified by the following specification of an inner coil which is analogous to prior art outer coil specification. An inner coil typically had a length of between 1.045 and 1.058 inch with an aperture of (0.068/0.070) inch. The outside measurement was 0.139 inch maximum. Outer coils presently are made with No. 30 "LITZ" wire and have 66 turns in 3 or 4 layers. The tapering of the ribs is to conform the outer windings of the outer coil into a rectangular geometry in which the broad faces are parallel to the chip plane and to maintain the mating magnets at an angle to the chip plane to provide an in-plane field there.

The following table indicates the drive coil inductance tolerance improvements in a number (between 150 and 200) of test packages. In the table, $\bar{L}$ is the inductance, and $\sigma$ is the variation in inductance over a package in microhenries ($\mu h$). The top three rows of the table shows values for an initial, intermediate, and present outer coil design period, from top to bottom, for free standing inner and outer coils, for free standing inner coil and bobbin-wound outer coil, and for the latter with a mold constraint. The advantages of the bobbin and mold constraints are clear.

| Drive Coil Inductance Tolerance Improvement | | |
|---|---|---|
| $\sigma$ | $\bar{L} + 2\sigma$ | PKG High/Low |
| $\mu h$ | $\mu h$ | $\mu h/\mu h$ |
| 1.48 | 16.5 ± 18% | 18.8/14.4 (±13%) |

| Drive Coil Inductance Tolerance Improvement -continued | | |
|---|---|---|
| $\sigma$ | $\bar{L} + 2\sigma$ | PKG High/Low |
| 1.19 | 61 ± 4% | 65.1/58.3 (±6%) |
| 0.42 | 59 ± 1% | 60.1/57.9 (±2%) |

What has been described is considered merely illustrative of the principles of this invention. Therefore, various modifications thereof can be devised by those skilled in the art within the spirit and scope of the invention as encompassed by the following claims:

What is claimed is:

1. A magnetic bubble memory including a layer of material in which magnetic bubbles can be moved, and means coupled to said layer for moving said bubbles therein, said means comprising a pattern of elements responsive to a magnetic field reorienting cyclically in the plane of said layer for generating moving magnetic pole patterns and field generating means for generating said field, said field generating means comprising first and second coils and a bobbin about which said second coil is wound, said bobbin fitting closely about said first coil in the absence of a bobbin for said first coil in a manner to define the minimum geometry for said second coil.

2. A magnetic bubble memory in accordance with claim 1 wherein said second coil has first and second broad surfaces and is encompassed by a solidified potting compound which includes grooves at said first and second surfaces.

3. A magnetic bubble memory in accordance with claim 2 wherein said solidified potting compound is of a geometry to mate with first and second magnets at said first and second broad surfaces respectively.

4. A mold arrangement for fabricating a magnetic memory in accordance with claim 1, said mold comprising at least first and second piece parts for defining a cavity having first and second faces bearing first and second sets of ribs respectively, said first and second sets of ribs being spaced apart a distance to confine said second coil when placed therewithin, said mold also including an inlet and an outlet for potting compound.

5. A mold arrangement in accordance with claim 4 wherein each rib of said first and second sets of ribs is tapered so that said second coil is confined to a rectangular geometry the outer broad faces of which are parallel to said layer.

6. A mold arrangement in accordance with claim 3 wherein each of said grooves is tapered to confine said second coil to a rectangular geometry the outer faces of which are parallel to said layer and to retain said first and second magnets at an angle to said layer.

7. A magnetic bubble memory in accordance with claim 1 including a bubble layer or chip support including parallel slots for receiving said first coil.

8. A magnetic bubble memory in accordance with claim 7 wherein said chip support is adapted to hold four magnetic bubble chips thereon.

9. For use in a magnetic bubble memory in accordance with claim 7, a bobbin having a geometry adapted to mate with said chip support.

10. A bobbin in accordance with claim 9 made of nonmagnetic material.

* * * * *